(12) United States Patent
Jansen et al.

(10) Patent No.: US 7,239,370 B2
(45) Date of Patent: Jul. 3, 2007

(54) LITHOGRAPHIC APPARATUS AND DEVICE MANUFACTURING METHOD

(75) Inventors: Albert Johannes Maria Jansen, Bladel (NL); Marcel Koenraad Marie Baggen, Nuenen (NL); Johannes Christiaan Maria Jasper, Veldhoven (NL); Raymond Laurentius Johannes Schrijver, Veldhoven (NL); Richard Joseph Bruls, Eindhoven (NL); Johannes Jacobus Matheus Baselmans, Orischot (NL); Willem Richard Pongers, Orischot (NL); Tammo Uitterdijk, De Bilt (NL)

(73) Assignee: ASML Netherlands B.V., Veldhoven (NL)

( * ) Notice: Subject to any disclaimer, the term of this patent is extended or adjusted under 35 U.S.C. 154(b) by 208 days.

(21) Appl. No.: 10/738,992

(22) Filed: Dec. 19, 2003

(65) Prior Publication Data

US 2004/0174509 A1 Sep. 9, 2004

(30) Foreign Application Priority Data

Dec. 23, 2002 (EP) .................................. 02080455
Jan. 13, 2003 (EP) .................................. 03075087

(51) Int. Cl.
*G21K 5/10* (2006.01)
*G03B 27/32* (2006.01)

(52) U.S. Cl. ............................. 355/53; 355/30; 355/77; 430/311; 250/492.22; 250/492.23

(58) Field of Classification Search .................... None
See application file for complete search history.

(56) References Cited

U.S. PATENT DOCUMENTS

| 5,581,324 | A | 12/1996 | Miyai et al. |
| 7,081,946 | B2 * | 7/2006 | Hagiwara et al. .............. 355/53 |
| 2002/0086224 | A1 | 7/2002 | Kanda |
| 2002/0112824 | A1 * | 8/2002 | Ballard et al. .............. 156/581 |

FOREIGN PATENT DOCUMENTS

| EP | 1 158 361 A1 | 11/2001 |
| EP | 1 231 513 A1 | 8/2002 |
| WO | WO200265519 | * 8/2002 |

* cited by examiner

*Primary Examiner*—John A. McPherson
*Assistant Examiner*—Daborah Chacko-Davis
(74) *Attorney, Agent, or Firm*—Pillsbury Winthrop Shaw Pittman LLP

(57) ABSTRACT

In a projection system a pattern plane on a reticle is illuminated to have a projection image focussed on an image plane. The presence of a pellicle in the optical path causes a virtual shift of the position of the pattern plane on the reticle. Depending on the presence or absence of the pellicle the image plane of the projection image needs to be adapted for proper focussing. A compensator counteracts the virtual shift of pattern plane due to the pellicle, by shifting the position of the pattern plane.

20 Claims, 8 Drawing Sheets

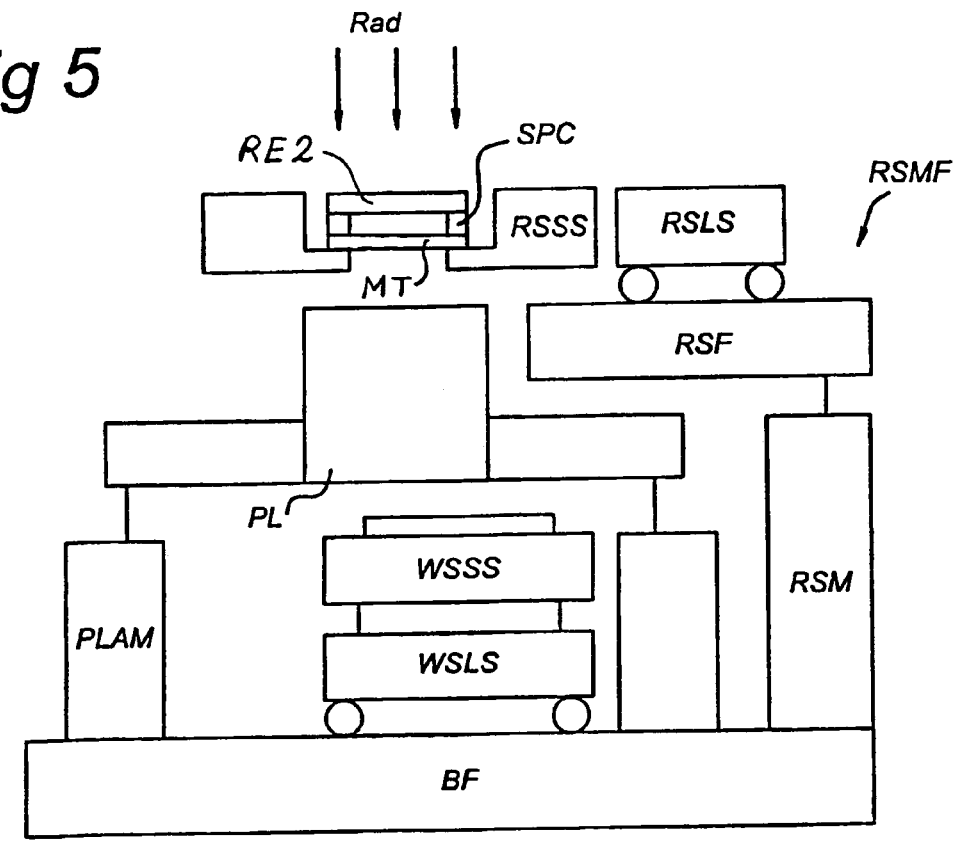
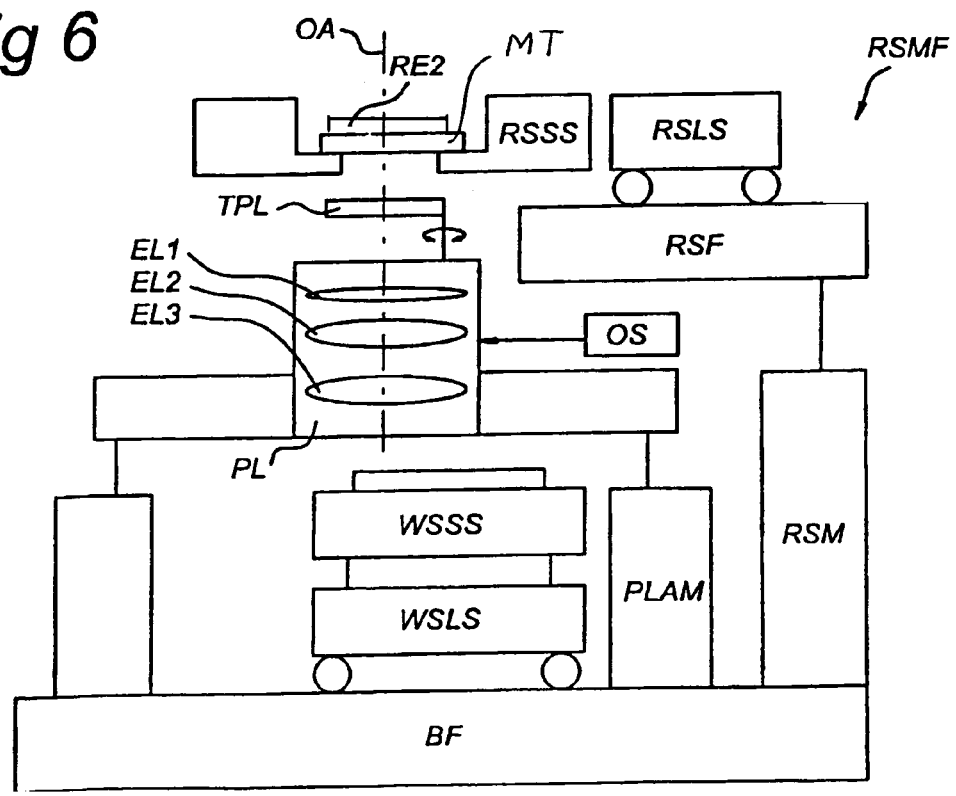

LITHOGRAPHIC APPARATUS AND DEVICE MANUFACTURING METHOD

This application claims priority from European Patent Application 02080455.5, filed Dec. 23, 2002 and European Patent Application 03075087.1, filed Jan. 13, 2003, which are herein incorporated by reference in their entirety.

BACKGROUND OF THE INVENTION

1. Field of the Invention

The present invention relates generally to lithographic apparatus and more particularly to lithographic apparatus including spatially modulated illumination nodes.

2. Description of the Prior Art

The term "patterning device" or "patterning structure" as here employed should be broadly interpreted as referring to devices that can be used to endow an incoming The present invention relates generally to lithographic apparatus and more particularly to lithographic projection apparatus having image correcting functionality. The term "patterning device" or "patterning structure" as here employed should be broadly interpreted as referring to devices that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning device include:

- A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, said support structure for holding a patterning device will also be referred to hereinafter as "mask table"; the mask table ensures that the mask can be held at a desired position in the incoming radiation beam, and it can be moved relative to the beam if so desired;

- A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as non-diffracted light. Using an appropriate filter, the said non-diffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localised electric field, or by employing piezoelectric actuators. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic controllers. In both of the situations described here above, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096. In the case of a programmable mirror array, the said support structure may be embodied as a frame or table, for example, which may be fixed or movable as required; and

- A programmable LCD array. An example of such a construction is given in U.S. Pat. No. 5,229,872. As above, the support structure in this case may be embodied as a frame or table, for example, which may be fixed or movable as required. For purposes of simplicity, the rest of this text may, at certain locations, specifically direct itself to examples involving a mask and mask table; however, the general principles discussed in such instances should be seen in the broader context of the patterning devices as set forth here above.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791.

The mask as introduced in the present text is also known as a "reticle", which term may be used hereinafter. Also, the mask table as described above may be referred to hereinafter as the "reticle stage". The position of the reticle stage and the substrate table are generally measured with one or more laser interferometers to obtain the necessary accuracy for positioning of the substrate during exposure and for mutual alignment of successive patterned layers of a device.

A reticle can be protected by a soft and/or thin pellicle to prevent damage to the pattern plane on the reticle. Such a soft pellicle typically comprises a thin polymer foil which is substantially parallel to the surface of the reticle, displaced at some substantially perpendicular distance to the reticle's surface.

For example, particles on the reticle could disadvantageously affect the pattern image generated by radiation impinging on the reticle. By intercepting particles on the pellicle on a surface which is not in the focal plane of the projection system, the quality of the image generated from the (clean) reticle can be substantially preserved.

It has been observed that short-wavelength radiation, such as deep ultraviolet radiation (e.g., 126 and 157 nm) and extreme ultraviolet radiation (EUV) (e.g., 5–20 nm) deteriorate the soft pellicle so rapidly that the use of a soft pellicle in combination with (deep) UV (or EUV) radiation may not be practical at this moment.

A replacement pellicle is being considered for reticles used in (deep) UV/EUV lithography applications. This replacement pellicle can withstand the (deep) UV/EUV radiation and comprises a thin glass plate which is transparent for the (deep) UV/EUV radiation. Due to the refracting properties of a glass plate (based on Snell's law), the radiation beam is refracted in such a way that an offset of the focal plane of a projection system for the generated pattern image occurs, and the location of the reticle relative to the projection system is changed accordingly.

However, such a change of the reticle location adversely affects the ability to use reticles without a pellicle during some procedures. For example, in wafer fabs for IC production many lithography tests are performed (some even on a routinely basis) which require the use of a pellicle-free reticle. A reticle without a pellicle may be used in such circumstances because the pattern may be more accurate without a pellicle.

The switching between reticles with or without a pellicle requires cumbersome and time-consuming modification of a lithographic projection apparatus and a reduction in the operational up-time of the apparatus. Preferably, an exchange of reticles with and without a pellicle should be performed within a few minutes (e.g., less than 10 min).

SUMMARY OF THE INVENTION

One aspect of embodiments of the present invention includes reducing the effort for switching between reticles with and without a pellicle in a lithographic projection apparatus. Thus, an embodiment of the present invention includes having a compensator constructed and arranged to adapt a position of a part of said reticle-stage module, said part of the reticle-stage module comprising at least the short-stroke module and the support structure, along an optical axis to compensate a virtual shift of a pattern plane of the patterning device due to a pellicle of said patterning device.

By providing a compensator as described above, a simple and relatively quick adaptation of the lithographic projection apparatus with respect to the position of the pattern plane can be achieved. Also, the application of a compensator reduces the possibility of errors and mistakes by operators in case it is necessary to exchange reticles with and without a pellicle.

The distance between the projection system and—in use—the reticle is changed by a change of the position of the short-stroke module. The optical setting of the projection system and its position relative to the wafer can remain unaltered but can equally well be used as further parameters for use to compensate for the virtual shift. With lithographic projection apparatus suitable for use with deep ultraviolet radiation, apparatus-internal space traversed by the projection beam is generally purged using a purge-gas which is substantially transmissive for said radiation (in contrast to, for example, air of the environment). A further advantage of the present invention is that the size of one or more purge-gaps (i.e., the size along a direction perpendicular to a purge-gas flow-direction in a purge-gap and substantially determining the flow rate of the purge-gas through the gap) between the reticle stage and wall-elements (provided to the short-stroke module and constructed and arranged for embodying part of a cavity to be purged adjacent to the reticle) is independent of an adaptation of position along the optical axis, as provided by the compensator. Control of the size of the one or more purge-gaps is of importance since the flow rate of the purge-gas through the one or more purge-gaps is directly related to said size. Narrowing a purge-gap reduces said flow rate, widening a purge-gap increases said flow rate. In particular at reduced flow rates there is the problem of diffusion of environmental gases (such as air) into the cavity which is to be purged.

In one embodiment, the compensator further comprises a spacer arrangement for adapting the position of the pattern plane along the optical axis. In this embodiment, the spacer arrangement is used to compensate for the virtual change of the pattern plane in dependence on the presence of a pellicle.

In a second embodiment, the compensator comprises an adjusting device for adjusting the projection system to adapt a position of its focal plane to coincide with the relative position of the pattern plane of the reticle. In this embodiment lower-order optical aberrations introduced by a pellicle or by the combination of the pellicle and the compensation for the virtual change of the pattern plane can be reduced and/or balanced to minimize the impact on quality of the projected pattern. The embodiment is of particular relevance for use with lithographic projection apparatus comprising a non-telecentric projection system. In such an apparatus the presence of a pellicle generally introduces several different lower-order aberrations simultaneously, and correction and/or balancing of these aberrations is possible by adjusting the optical setting of the projection system.

Additionally, a lithographic projection apparatus may be provided wherein the adjusting device adjusts the projection system's focal plane by modifying a position of an optical element of the projection system, relative to another optical element of the projection system. Within the projection system the optical setting is changed in order to adapt to a virtual shift of the pattern plane of the reticle in dependence on the presence of a pellicle.

Moreover, a lithographic projection apparatus may be provided wherein the adjusting device adjusts the projection system's focal plane by inserting an optical element or a layer of transmissive material acting as a dummy pellicle in the optical path to create a correction of the focal plane of the projection system.

Additionally, a lithographic projection apparatus may be provided wherein the apparatus comprises a sensor, the sensor being constructed and arranged to detect a position of the pattern plane, and the actuator is constructed and arranged to adjust the position of the pattern plane in response to the presence or absence of the pellicle.

Furthermore, a lithographic projection apparatus may be provided wherein the apparatus comprises a further sensor, the further sensor being constructed and arranged to detect a presence or absence of a pellicle, and the actuator is constructed and arranged to adjust the position of the pattern plane in response to the presence or absence of the pellicle as detected by the further sensor.

According to a further aspect of the invention there is provided a device manufacturing method for use with a lithographic projection apparatus including a reticle-stage module comprising a support structure for supporting a patterning device and a short-stroke module for fine-postioning said support structure, the patterning device serving to pattern a projection beam according to a desired pattern; a substrate table for holding a substrate; and a projection system for projecting the patterned beam onto a target portion of the substrate, said projection system having an optical axis, providing a substrate that is at least partially covered by a layer of radiation-sensitive material; providing a projection beam of radiation using a radiation system; using patterning device to endow the projection beam with a pattern in its cross-section; and projecting the patterned beam of radiation onto a target portion of the layer of radiation-sensitive material using a projection system, and adapting a position of said short-stroke module along said optical axis to compensate a virtual shift of a pattern plane of said patterning device due to a pellicle of said patterning device.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The person skilled in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm).

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 shows a first embodiment of a lithographic projection apparatus according to the present invention for a reticle with a pellicle;

FIG. 6 shows a second embodiment of a lithographic projection apparatus according to the present invention.

DETAILED DESCRIPTION OF THE PRESENT INVENTION

Figure 1:
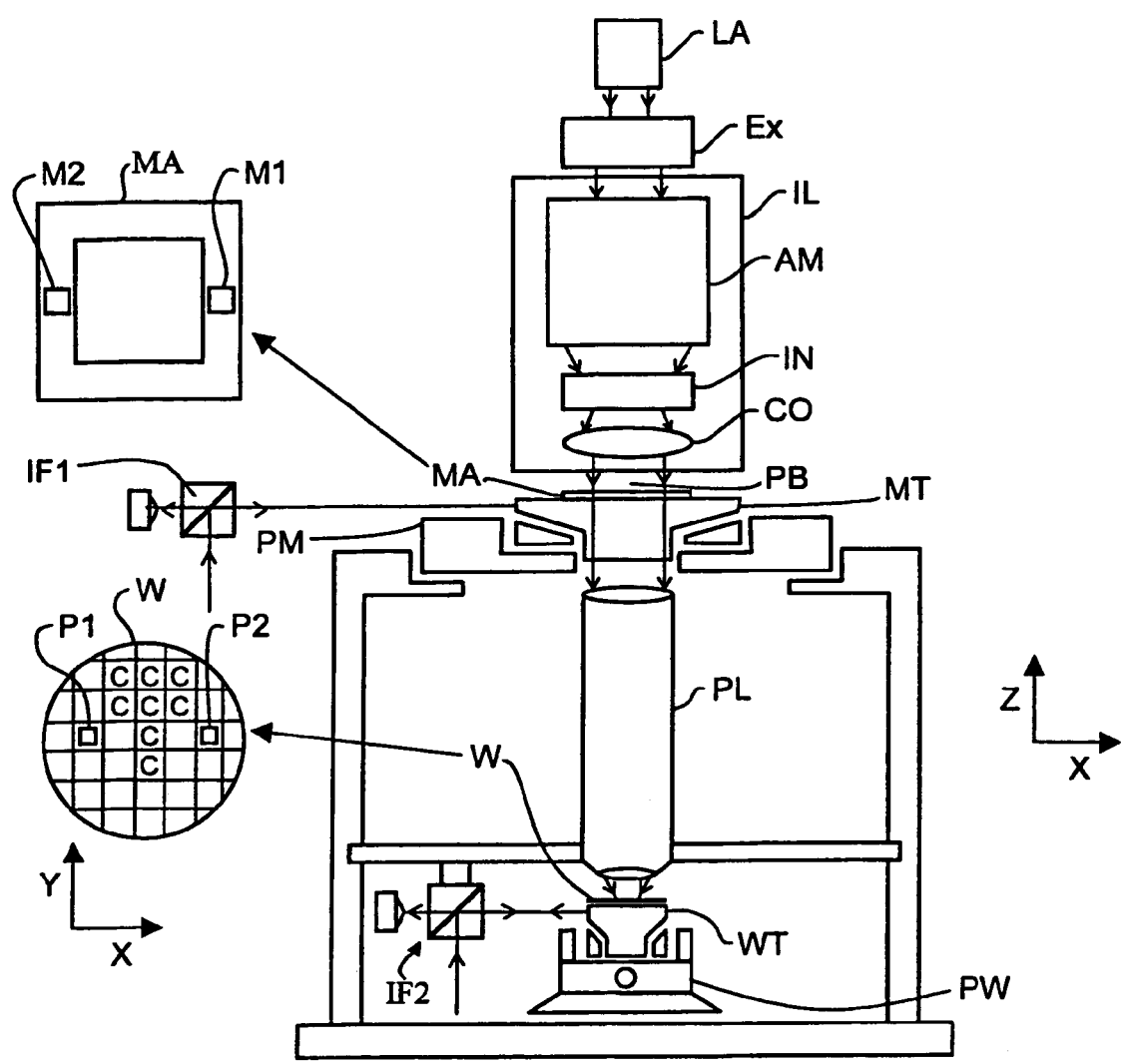
FIG. 1 depicts a lithographic projection apparatus according to an embodiment of the invention.

FIG. 1 schematically depicts a lithographic projection apparatus according to a particular embodiment of the invention. The apparatus can comprise:

a radiation system Ex, IL, for supplying a projection beam PB of radiation (e.g. deep UV radiation such as for example generated by an excimer laser operating at a wavelength of 193 nm or 157 nm, or EUV radiation as generated by a laser-fired plasma source operating at 13.6 nm). In this particular case, the radiation system also comprises a radiation source LA;

a first object table (mask table, reticle stage) MT provided with a mask holder for holding a mask MA (e.g. a reticle), and connected to first positioning means PM for accurately positioning the mask with respect to item PL; first interferometric measuring means IF1 is provided for measuring the position of the mask table. The mask holder is not shown in FIG. 1; it can be embodied, for example, as means for holding the mask by attraction or vacuum.

a second object table (substrate table) WT provided with a substrate holder for holding a substrate W (e.g. a resist-coated silicon wafer), and connected to second positioning means PW for accurately positioning the substrate with respect to item PL; and a projection system ("lens") PL (e.g. a quartz and/or $CaF_2$ lens system or a catadioptric system comprising lens elements made from such materials, or a mirror system) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type (with a reflective mask). Alternatively, the apparatus may employ another kind of patterning device, such as a programmable mirror array of a type as referred to above.

The source LA (e.g. a mercury lamp or a UV excimer laser, a laser-fired plasma source, a discharge source, or an undulator or wiggler provided around the path of an electron beam in a storage ring or synchrotron) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively transmitted by the mask MA, the beam PB passes through the projection system PL, which focuses the beam PB onto a target portion C of the substrate W. With the aid of the second positioning means PW (and second interferometric measuring means IF2), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realised with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the X and/or Y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
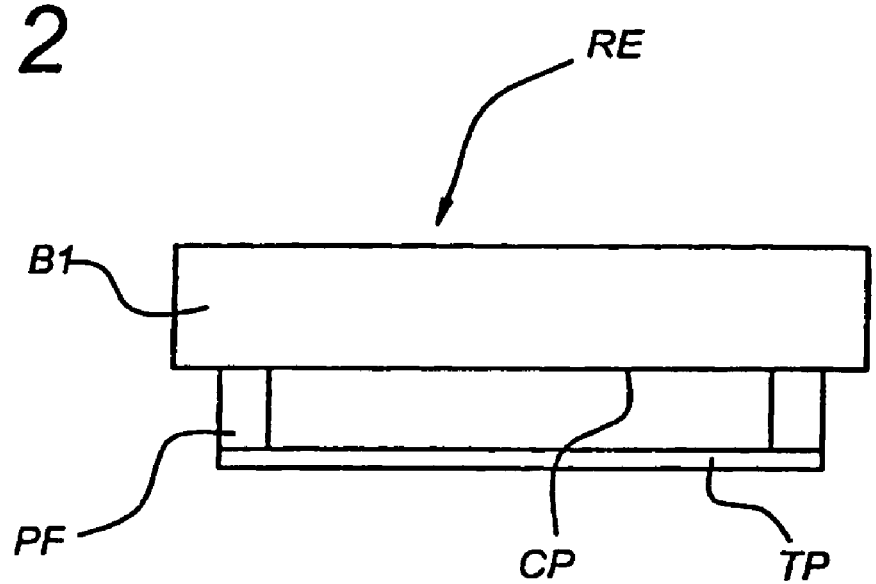
FIG. 2 shows schematically a cross-section of a reticle fitted with a pellicle.

FIG. 2 shows schematically a cross-section of a reticle fitted with a pellicle.

The reticle RE comprises a supporting body B1, a pattern plane CP, a pellicle frame PF and a pellicle TP. The pattern plane CP comprises in this case of a patterned layer located on a portion of a surface of the supporting body B1. The pellicle frame PF is positioned on the supporting body B1 and surrounds the pattern plane, e.g., the patterned layer CP. The pellicle TP is located on the pellicle frame PF displaced from the pattern plane CP for protecting the pattern plane CP from contamination by particles, etc. The pellicle TP comprises a material which is transparent for the radiation and resistant to decay by the radiation. Such a material may be a glass compound as known to persons skilled in the art.

Figure 3:
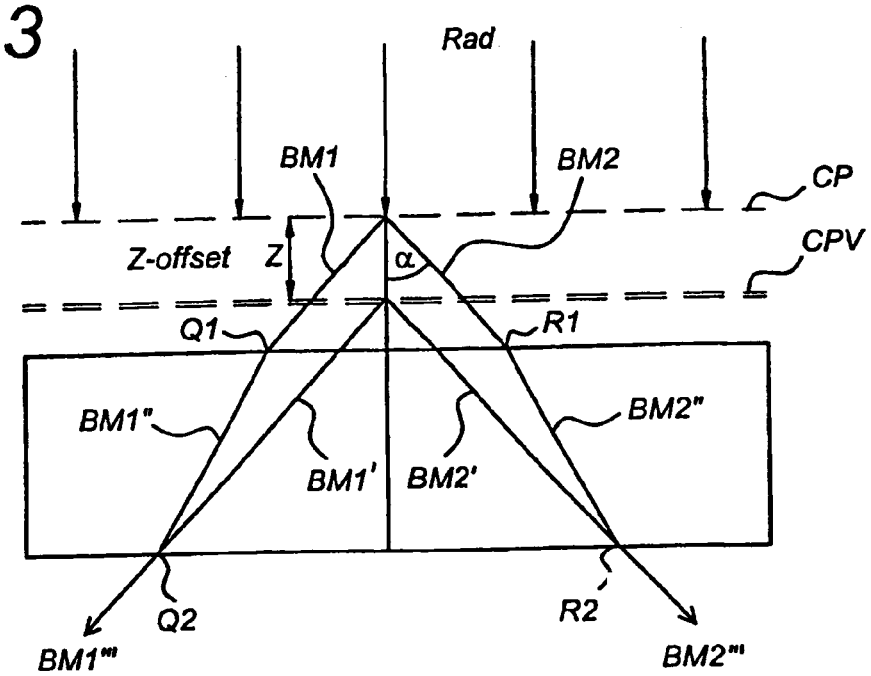
FIG. 3 shows schematically an influence of optical refraction in the pellicle on light paths created on the reticle plane.

FIG. 3 shows schematically an influence of optical refraction in the pellicle on light paths created on the reticle plane. In FIG. 3 a part of the reticle RE as depicted in FIG. 2 is shown.

The refraction by the pellicle TP will be explained for a transmissive reticle RE. An incoming beam of radiation, indicated by arrows Rad, (e.g., in the (deep) UV range, 157 or 126 nm) is aimed at the pattern plane CP of the reticle RE. On the pattern plane CP the incoming beam is locally diffracted (depending on the pattern) into schematically a first outgoing beam BM1 and a second outgoing beam BM2.

The optical path of the incoming beam BM1 enters the pellicle TP at a first location Q1. Upon entry in the pellicle TP at Q1, the beam BM1 refracts and traverses along path BM1" to point Q2 where the beam exits the pellicle TP and continues along path BM1'" towards the projection system PL (not shown here) which is set to have its focal plane coinciding with the pattern plane of the reticle, with the pellicle TP in place.

The second outgoing beam BM2 enters the pellicle TP along path BM2 at point R1, refracts in the pellicle material, traverses the pellicle along path BM2", exits at point R2, and continues along path BM2'" also towards the projection system PL.

Due to the refraction at the pellicle TP (given its refractive index for the wavelength of the radiation), a virtual z-offset (z-shift) Z of the image of pattern plane CP occurs. Apparently, the beams BM1 and BM2 have followed (in this FIG. 3) the virtual paths BM1' and BM2', respectively, which intersect on a virtual pattern plane CPV, located at a distance Z closer to the location where the pellicle TP is actually located. Since the focal plane of the projection system PL is set to coincide with the pattern plane CP of the reticle, changing from a reticle with a pellicle to a reticle without one (or vice versa), necessitates a change of the z-position of the reticle relative to the focal plane of the projection system PL to obtain a focussed pattern image on the target portion C of the substrate W.

Typically, for a pellicle TP with a thickness of 800 μm, a radiation wavelength of 157 nm, an index of refraction of the pellicle material of fused silica and an entry angle of the radiation beam BM1, BM2 above the critical angle, a shift of about 312 μm is required to restore focus when exchanging a reticle with a pellicle TP and a reticle without one. For another combination of parameters for the pellicle TP the required shift will change accordingly as will be known by persons skilled in the art.

According to an embodiment of the present invention means for relatively quick adaptation of the z-position of the reticle are provided to, for example, allow for exchange of a reticle with a pellicle for a reticle without a pellicle and vice versa. It is noted that the position of the projection system as a whole is not to be changed for this purpose since this would require a further major effort to re-calibrate the lithographic projection apparatus relative to the projection plane at the target portion C.

Figure 4:
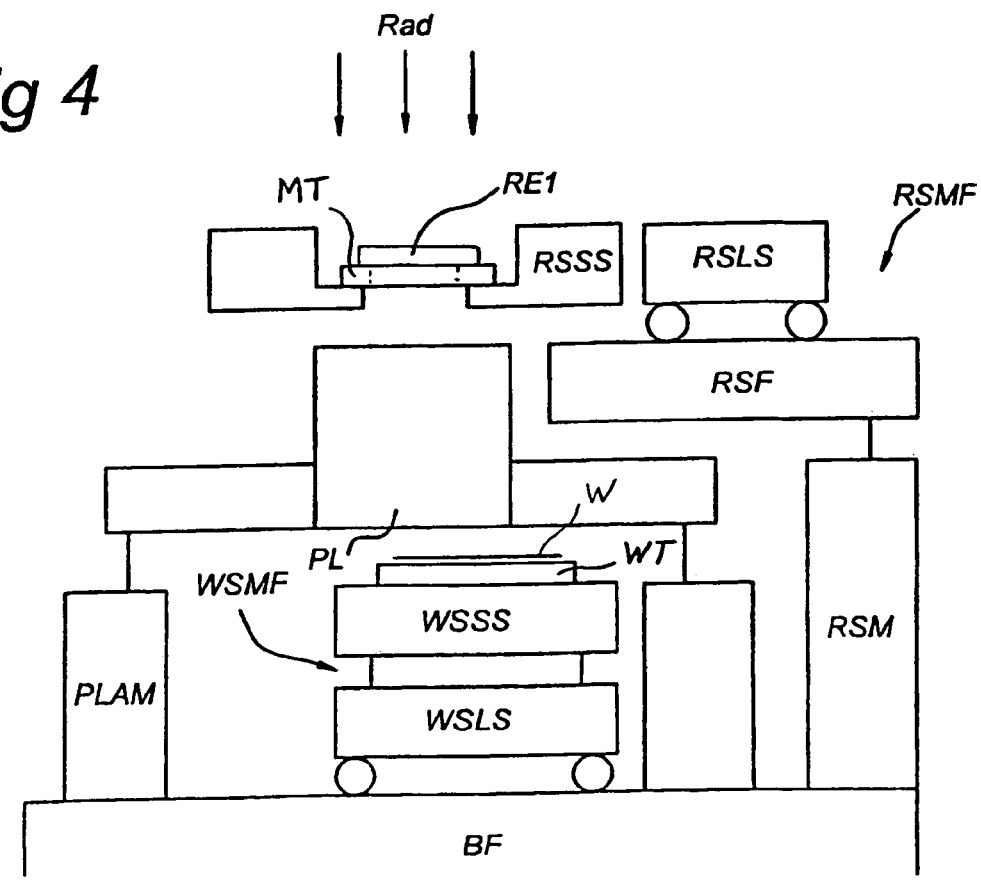
FIG. 4 shows a first embodiment of a lithographic projection apparatus according to the present invention for a reticle without a pellicle.

FIG. 4 shows a first embodiment of a lithographic projection apparatus according to the present invention, for a reticle RE1 without a pellicle.

The lithographic projection apparatus shown in FIG. 4 is of a transmissive type. The illumination system (not shown here) directs radiation in the direction of the reticle, as indicated by arrow Rad.

The lithographic projection apparatus comprises a base frame BF, a reticle-stage module RSMF, the projection system PL, adjusting means PLAM, and a wafer-stage module WSMF.

The base frame BF supports the wafer-stage module WSMF. The wafer-stage module WSMF comprises a short-stroke wafer-stage module WSSS and a long-stroke wafer-stage module WSLS for positioning a wafer supported on the wafer stage WT. The short-stroke wafer-stage module WSSS is supported by the long-stroke wafer-stage module WSLS to allow a combined fine- and coarse-positioning operation of the wafer stage WT.

Also, on the base frame BF the adjustment means PLAM for isolating the projection system PL from vibrations are positioned. On top of the adjustment means PLAM, the projection system PL is located above the wafer-stage module WSMF for projecting a pattern image on target portions of the wafer supported on the wafer stage WT.

Further, the reticle-stage module RSMF is supported on the base-frame BF. The reticle-stage module RSMF comprises a mount RSM, a support frame RSF, a long-stroke module RSLS, a short-stroke module RSSS, and the reticle stage MT. For clarity, said long-stroke module RSLS and said short-stroke module RSSS will also be referred to hereinafter as the long-stroke reticle-stage module RSLS and the short-stroke reticle-stage module RSSS.

The mount RSM is located on the base frame BF. The support frame RSF is provided on top of the mount RSM. Here too, for clarity, said mount RSM and said suport frame RSF will also be referred to hereinafter as the reticle-stage mount RSM and the reticle-stage support frame RSF.

The short-stroke reticle-stage module RSSS and the long-stroke reticle-stage module RSLS are supported on the support frame RSF: the short-stroke reticle-stage module RSSS is located within the long-stroke reticle-stage module RSLS in order to allow a combined fine- and coarse-positioning operation of the reticle stage MT. The reticle RE1 is positioned on the reticle stage MT which is carried by the short-stroke reticle-stage module RSSS.

In FIG. 4 a reticle RE1 without a pellicle TP is positioned on the reticle stage MT. The projection system PL is set to have its focal plane on the pattern plane CP.

FIG. 5 shows a first embodiment of a lithographic projection apparatus according to the present invention for a reticle RE2 with a pellicle TP (not shown).

In FIG. 5 a reticle RE2 with a pellicle TP (not shown) is provided on the reticle stage MT. The projection system PL is still set to have its focal plane on the pattern plane CP. According to the first embodiment of the present invention, the virtual z-offset caused by the pellicle TP is compensated by introducing a spacer arrangement SPC in between the reticle stage MT and the reticle RE2.

The thin spacer arrangement SPC may be arranged as a separate insert in which the spacer arrangement is positioned at the periphery of the reticle. Also, the spacer arrangement SPC may be attached to the reticle RE2 in a fixed position.

To account for different pellicles, varying sizes of spacer arrangements may be provided. Alternatively, the spacer arrangement may be adjustable. The appropriate spacer arrangement can be determined by detection, e.g., determining the pellicle size from reticle bar code information.

Preferably, the spacer arrangement SPC can be handled in an automated manner by the mask handling system, since the spacer arrangement SPC for the reticle RE2 is typically required during operation of the lithographic projection apparatus during a production phase. The detection of the presence or absence of a pellicle will be described later in more detail.

Alternatively, it is conceivable to have a spacer arrangement SPC during testing procedures (i.e., the projection system PL is set with its focal plane coinciding with the pattern plane CP of a reticle RE2 equipped with a pellicle TP). In that case, the spacer arrangement SPC is arranged in such a way that a reticle RE1 without a pellicle TP is positioned closer to the projection system PL.

It is noted that no major modification to the lithographic projection apparatus is needed in this case. Possibly, some modification may be needed for handling the automated transport of reticles RE1, RE2 to/from a mask library. In some occasions where exchanging a reticle with a pellicle for a reticle without one, and vice versa, may occur relatively infrequently, it is conceivable that the adaptation of the pattern plane relative to the focal plane of the projection system PL is done by a manual mounting/unmounting of the spacer arrangement SPC. FIG. 6 shows a second embodiment of a lithographic projection apparatus according to the present invention.

In FIG. 6 a reticle RE2 with a pellicle TP (not shown) is provided on the reticle stage MT which is carried by the short-stroke reticle-stage module RSSS.

According to the second embodiment of the present invention, the z-offset caused by the pellicle TP is compensated by adjusting device OS for an adjustment of the optical setting of the projection system PL. As described above, the projection system PL may be an arrangement of a plurality of optical components, shown here in this example schematically by just three elements EL1, EL2, EL3. The adjusting device OS is capable of adjusting the optical setting of the projection system by, for example, setting the position of one or more optical components EL1, EL2, EL3, relative to each other, along the optical axis OA of the projection system PL. By changing the optical setting the focal plane of the projection system PL can be modified in such a way that the focal plane coincides with the pattern plane CP (see FIG. 3).

When a reticle RE2 with a pellicle TP is exchanged for a reticle RE1 without a pellicle, and vice versa, the optical setting of the projection system PL is changed in such a way that the focal plane of the projection system PL again coincides with the pattern plane CP of the reticle RE1 and vice versa. The present embodiment is of particular use in the presence of a non-telecentric projection system, because compensation for a pellicle by adapting a position of part of the reticle-stage module introduces, in the presence of non-telecentricity, additional lower order aberrations that can be corrected preferably as described above by adjusting the optical setting of the projection system.

The change of the optical setting occurs after detecting the presence or absence of a pellicle, e.g., by a sensor (not shown here). In response to the detection, the optical setting is modified by the adjusting device OS. Modifying the optical setting can be done in any conceivable way known to persons skilled in the art, for example by a change from one predetermined configuration of the optical elements EL1, EL2, EL3 for a first optical setting for a reticle without a pellicle to another predetermined configuration for a second optical setting for a reticle with a pellicle. Also a new optical setting may be obtained by a computation using some optical theory. Furthermore, the configuration of the optical elements EL1, EL2, EL3 may be adapted by detecting some (optical) marker or a change thereof.

Figure 10:
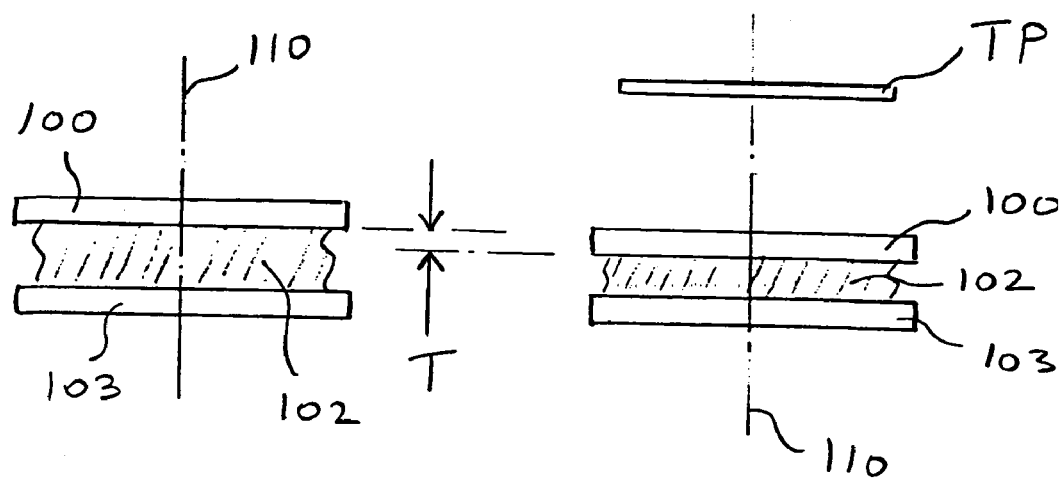
FIG. 10 illustrates an adjusting device for adjusting a projection system

In a preferred embodiment a shutter TPL, comprising an optical element acting as a dummy pellicle, is provided at the top of the projection system PL to achieve the adjustment of the optical setting. By inserting or closing the shutter TPL in the optical path a z-offset correction can be created for the projection system PL. An advantage of this embodiment is that the optical pathlength along the optical axis of the projection system, between the pattern plane and the substrate is a constant optical pathlength, independent of the the use of a reticle with or without pellicle, respectively a reticle RE2 and RE1. The optical pathlength comprises in both cases the pathlength through the pellicle and the pathlength through the projection system. This allows for optimal aberration correction in the nominal design of the projection system, and hence, for optimal lithographic imaging performance of the apparatus. A constant optical pathlength as described here can also be obtained by disposing in the path traversed by the (in use patterned) projection beam downstream of the reticle a pathlength-compensation optical system constructed and arranged for adjusting its optical pathlength along the optical axis of the projection system by variation of its thickness. For example, the pathlength-compensation system may comprise a liquid layer 102, between two transmissive elements 100 and 103, as illustrated in FIG. 10, whereby the transmissive elements are movable along the optical axis 110 with respect to each other. When switching from the use of a reticle RE1 without pellicle TP to the use of a reticle RE2 with pellicle TP, the thickness of the pathlength-compensation system is reduced to compensate for the presence of said pellicle. And, vice versa, when switching from the use of a reticle RE2 to the use of a reticle RE1 the thickness of the pathlength-compensation system is increased to compensate for the absence of said pellicle TP. The latter increase of thickness required to maintain equal optical pathlength is indicated as T in FIG. 10. If $n_{pel}$ and $t_{pel}$ are the refractive index and the thickness of the pellicle, and $n_{liq}$ is the refractive index of the liquid layer 102, than optical pathlength is maintained when $Tn_{liq} = t_{pel} n_{pel}$.

The transmissive elements can be embodied as plane parralel plates to provide a simple and cost-efficient structure. However, the shape of the elements is in principle free and can for example comprise spherical surfaces and/or aspherical surfaces.

The use of a liquid layer of variable thickness provides additional flexibility with mimicking a thickness variation of a pellicle or with compensating for different thicknesses of corresponding different pellicles. A dummy (solid) pellicle does not offer such flexibility.

Another advantage of a liquid film is that global thickness variations can be compensated by introducing a liquid film thickness variation. For example, the elements 100 and 103 could be tilted with respect to each other. Hence, this degree of freedom can, for example, either be used to mimick a wedge error of a pellicle for which compensation is to be provided, or it can be used to, for example, compensate any residual comatic aberration. It is noted that the position of the projection system PL as a whole is preferably not changed during an adjustment of the optical setting.

Figure 7:
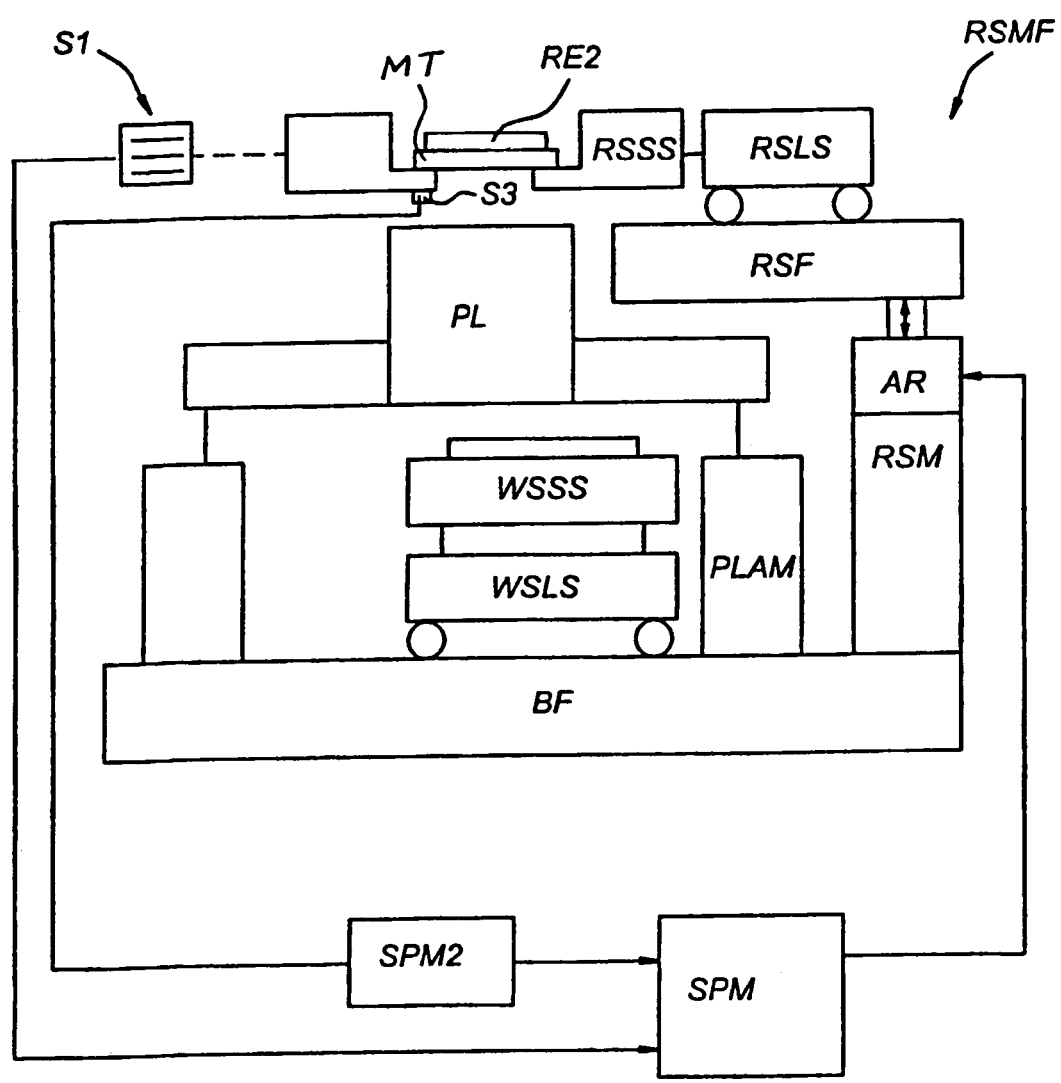
FIG. 7 shows a third embodiment of a lithographic projection apparatus according to the present invention.

FIG. 7 shows a third embodiment of a lithographic projection apparatus according to the present invention.

In FIG. 7 reticle RE2 with a pellicle TP (not shown) is provided on the reticle stage MT carried by the short-stroke reticle-stage module RSSS.

Figure 8:
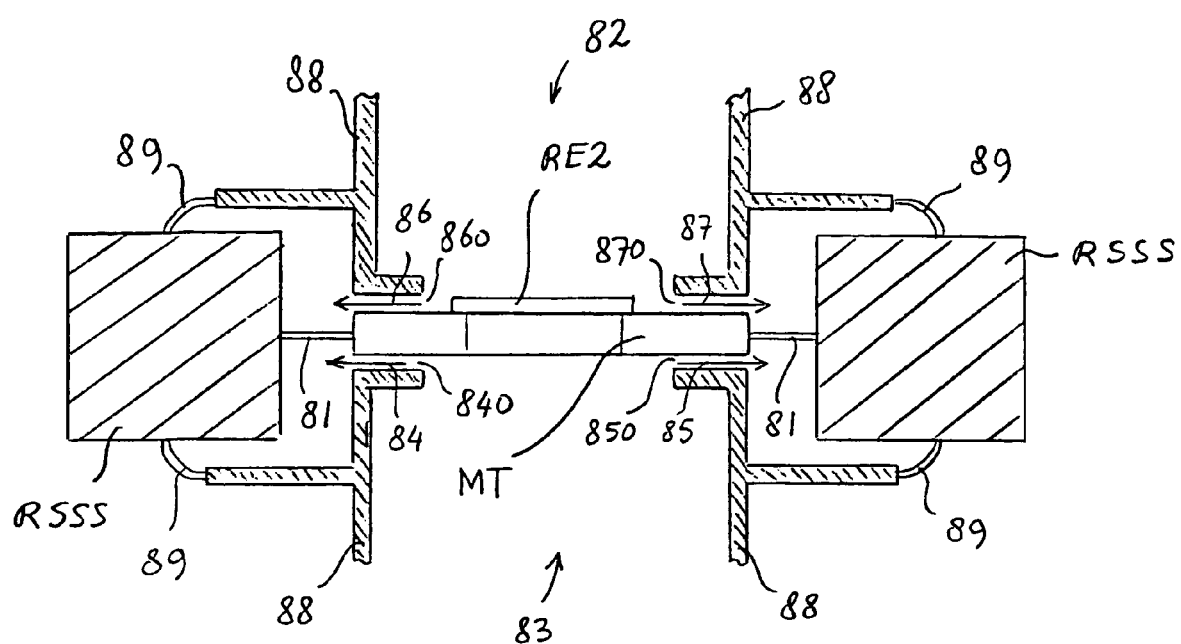
FIG. 8 shows an embodiment of a cavity to be purged adjacent to the reticle, with wall-elements provided to a short-stroke module.

According to the third embodiment, the z-offset caused by the pellicle TP is compensated by an adjustment of the position of the part of the reticle-stage module RSMF comprising the short-stroke module RSSS and the reticle stage MT in the direction of the z-offset. The distance between the projection system and—in use—the reticle is changed by a change of the position of the short-stroke module RSSS. The optical setting of the projection system and its position relative to the wafer can remain unaltered but can equally well be used as further parameters for use to compensate for the virtual shift. With lithographic projection apparatus suitable for use with deep ultraviolet radiation apparatus-internal space traversed by the projection beam is generally purged using a purge-gas which is substantially transmissive for said radiation (in contrast to, for example, the air of the environment). In FIG. 8 an embodiment of wall-elements 88 forming part of cavities 82 and 83 to be purged is shown. The cavities 82 and 83 are adjacent to the reticle RE2. The wall-elements 88 are connected to the short-stroke module RSSS using mounting elements 89. The wall-elements 88 are positioned slightly away from the reticle stage MT to create purge-gaps 840, 850, 860, and 870. Due to an overpressure of the purge gas in the cavities 83 and 84, out-bound purge-gas flows in the purge gaps 840, 850, 860, and 870 occur, with corresponding purge-gas flow-directions 84, 85,86, 87. Here, the size along a direction perpendicular to a purge-gas flow-direction 84, 85,86, 87, in a corresponding purge-gap 840, 850, 860, and 870 substantially determines the flow rate of the purge-gas through the corresponding purge-gap. An advantage of the present invention is that the size of one or more of the purge-gaps 840, 850, 860, and 870 between the reticle stage MT and wall-elements 88 is independent of an adaptation of position along the optical axis of the system comprising the reticle stage MT, the short-stroke module RSSS, and short-stroke actuators/guides 81, as provided by the compensator. Control of said size of the purge-gaps is of importance since the flow rate of the purge-gas through the one or more purge-gaps 840, 850, 860, and 870 is directly related to said size. Narrowing a purge-gap reduces said flow rate, widening a purge-gap increases said flow rate. In particular at reduced flow rates there is the possibility of diffusion of environmental gases (such as air) into the cavities 82 and 83 which may, for example, render the transmission along the path of the projection beam traversing the cavities 82 and 83 out of tolerance. In the present embodiment, this possibility is avoided effectively; the size of the purge-gaps 840, 850, 860, and 870 is fixed mechanically, for any reticle and for any compensation of said z-offset.

The reticle-stage module RSMF according to the third embodiment comprises one or more actuators AR and sensor S1 for measuring a presence of the pellicle TP of an installed reticle. The actuators AR are part of the compensator constructed and arranged to adapt a position of a part of the reticle-stage module.

Figure 9:
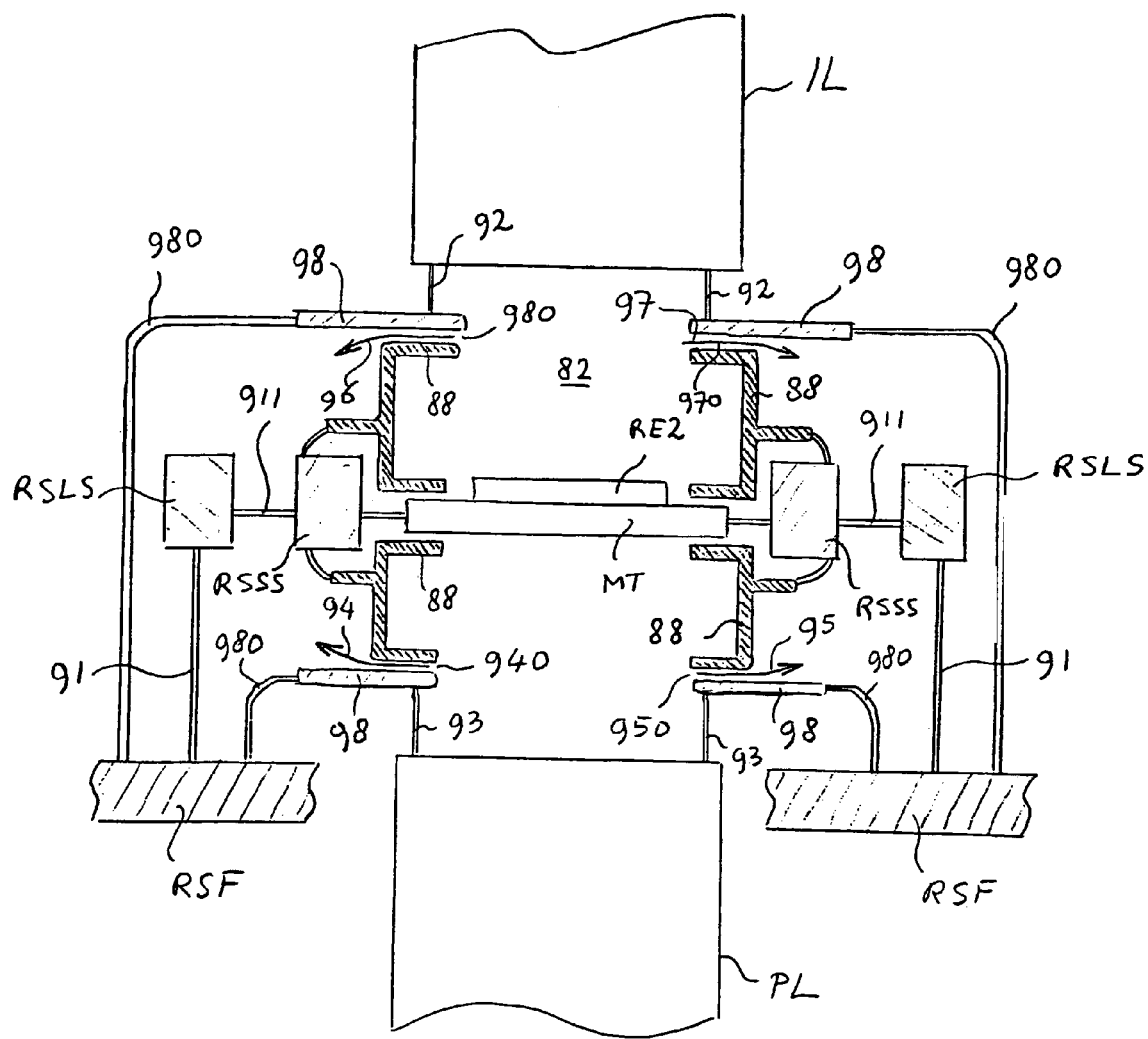
FIG. 9 shows an embodiment of a cavity to be purged adjacent to the reticle, with wall-elements provided to a support frame.

In the present embodiment, the actuators AR can be provided between the mount RSM and the support frame RSF so that the reticle-stage support frame RSF can be moved by an action of the actuators AR in the direction of the z-offset for compensating a change of the position of the pattern plane of the reticle relative to the focal plane of the projection system PL. This embodiment is of advantage for scanning lithographic projection apparatus; an embodiment of the cavities 82 and 83 to be purged for a scanning lithographic projection apparatus is shown schematically in FIG. 9. Between wall-elements 88 which move during scanning with the short-stroke module and wall-elements 98 which are mechanically connected through mounting elements 980 with the support frame RSF there are purge-gaps 940, 950, 960, and 970. Corresponding outbound purge-gas flows 94, 95, 96, and 97 are illustrated. As described above, control of the size of these purge-gaps is necessary. In the present embodiment, the size of the purge-gaps 940, 950, 960, and 970 is fixed mechanically through the mounting elements 980, the mounting elements 911 connecting the long-stroke module to the shrt-stroke module and the guides 91 for guiding the scanning motion of the long-stroke module RSLS, in addition to the corresponding elements in FIG. 8. By adaptation of the z-position of the whole assembly comprising the support frame RSF, the long-stroke module RSLS, the short-stroke module RSSS and the mask table MT, the size of the purge-gaps 940, 950, 960, and 970 is fixed mechanically, for any reticle and for any compensation of said z-offset. Such an adaptation is possible without affecting the position of the illumination system IL and the projection system PL by employing flexible walls 92 and 93.

It is possible to install the actuators AR at various other positions: e.g., between the support frame RSF and long-stroke reticle-stage module RSLS, between the long-stroke reticle-stage module RSLS and short-stroke reticle-stage module RSSS, and between the short-stroke reticle-stage module RSSS and the reticle stage MT. It is also possible to move the wall elements 98 with separate actuators to keep the size of the purge-gaps 940, 950, 960, and 970 substantially constant.

The sensor S1 for measuring the relative (or absolute, if desired) position of the reticle RE2 is preferably provided on the reticle-stage support frame RSF and/or on the short-stroke reticle-stage module RSSS. (In FIG. 7 the sensor S1 is only depicted with a link to the short-stroke reticle-stage module RSSS.) Alternatively, the sensor S1 may be provided on the projection lens frame.

Further, the actuators AR and sensor S1 are each connected to a signal processing module SPM for controlling movements of at least a part of the reticle-stage module RSMF.

In use, the movement generated by the actuators AR is measured by the sensor S1. The signals from the sensor are used as input to the signal processing module SPM which is arranged to compare the input signals to a reference signal representing predetermined z-offset values stored in memory linked to (or embedded in) the signal processing module SPM and to control the movement of the actuators based on the result of the comparison. It is noted that the signal processing module SPM may be implemented as a digital processing device, an analog processing device, or as a software module executable by a computer.

The actuators AR may be arranged to provide a pneumatic two-state adjustment, or a continuous adjustment by stepper motors, or servo motors, each type of actuator being equipped with its respective control.

It is noted that other types of sensors that are capable of sensing the presence of a pellicle with the reticle may be applied in the present invention. The sensor S1 may also comprise a barcode reader for reading a barcode on a reticle, from which code the presence of a pellicle can be derived. Further, the sensor S1 may be provided as a weight sensor that derives the presence of a pellicle from the weight of the reticle. For example, such a weight sensor may be incorporated in the short-stroke reticle-stage module RSSS. Also, the sensor S1 may be provided as an optical sensor which determines during an alignment procedure of the reticle stage MT the result of an effort to focus the reticle while in contact with the short-stroke reticle-stage module RSSS. The result of the focussing procedure determines the information the optical sensor obtains about the presence of a pellicle. Such a sensor may also provide for the control of the actuators AR when moving at least a part of the reticle-stage module RSMF.

It is further noted that in the second and third embodiments an automatic sensing of the presence of a reticle RE1 without pellicle or a reticle RE2 with pellicle TP may preferably be done by an additional sensor system S3, which is only shown schematically in FIG. 7. Such a sensor system S3 may be connected to a further signal processing module SPM2 which is arranged to control the adjustment of projection system PL, and the reticle-stage module RSMF, respectively, in an automated manner upon detection of a reticle RE2 with a pellicle or a reticle RE1 without one.

In the third embodiment, further signal processing module SPM2 is preferably connected to signal processing module SPM for controlling the actuators AR in further dependence of the signals of sensor system S3.

In the second embodiment, further signal processing module SPM2 is preferably connected to adjusting means OS for adjusting the optical setting of the projection system by setting the position of one or more of the optical components EL1, EL2, EL3, relative to each other, along the optical axis OA of the projection system PL. Also, it is possible that the adjusting means OS are arranged for modifying the individual shape of optical elements to bring about a desired change of the optical setting of the projection system PL.

Alternatively, in case of the third embodiment, sensor system S3 can also be connected directly to the signal processing module SPM already present. Furthermore, it is noted that alternatively sensor S1 may also provide for the sensing of the presence of a reticle RE1 without a pellicle or a reticle RE2 with a pellicle TP.

It is noted that in the second and third embodiments that on some occasions an automated adaptation of the lithographic projection apparatus in relation to the presence or absence of a pellicle may not be required. In such cases it is conceivable that the adaptation of the pattern plane relative to the focal plane of the projection system PL is done by a manual control of the respective element, e.g., adjusting device OS, shutter TPL and/or actuator AR.

Persons skilled in the art will appreciate that other alternative and equivalent embodiments of the invention can be conceived and reduced to practice without departing from the true spirit of the invention, the scope of the invention being limited only by the appended claims.

What is claimed is:

1. A lithographic projection apparatus comprising:
    a reticle-stage module comprising a support structure to support a patterning device, a short-stroke module to fine-position said support structure, and a long-stroke module to coarse-position the patterning device, the patterning device constructed and arranged to pattern a beam of radiation according to a desired pattern;
    a substrate table to hold a substrate;

a projection system to project the patterned beam onto a target portion of the substrate, the projection system having an optical axis; and a position controller constructed and arranged to adapt a position of at least a part of said reticle-stage module, the part of the reticle-stage module including at least the long-stroke module, the short-stroke module and the support structure, along said optical axis to compensate for a virtual shift of a pattern plane of said patterning device due to a pellicle positioned proximate the patterning device.

2. Apparatus according to claim 1, wherein said part of the reticle-stage module further comprises a support frame to support the long-stroke module.

3. Apparatus according to claim 1, wherein the virtual shift is dependent on at least one of a thickness of said pellicle, a wavelength of said projection beam, and an index of refraction of a material comprising the pellicle.

4. Apparatus according to claim 1, wherein said position controller further comprises a spacer arrangement to change said position of said pattern plane along said optical axis.

5. Apparatus according to claim 1, wherein said position controller further comprises an adjusting device to adjust said projection system to adapt a position of its focal plane to coincide with said pattern plane.

6. Apparatus according to claim 5, wherein said adjusting device adjusts said projection system's focal plane by modifying a position of an optical element of said projection system, relative to another optical element of said projection system.

7. Apparatus according to claim 5, wherein said adjusting device adjusts said projection system's focal plane by disposing a layer of transmissive material acting as a dummy pellicle in said optical path to create a correction of said focal plane of said projection system.

8. Apparatus according to claim 5, wherein the pellicle is a dummy pellicle and said adjusting device adjusts said projection system's focal plane by disposing an optical element acting as the dummy pellicle in said optical path to create a correction of said focal plane of said projection system.

9. Apparatus according to claim 1, wherein said position controller comprises an actuator configured to adapt said position of said pattern plane along said optical axis.

10. Apparatus according to claim 9, wherein said apparatus comprises a sensor, said sensor being constructed and arranged to detect a position of the pattern plane, and said actuator is constructed and arranged to adjust the position of the pattern plane in response to presence or absence of the pellicle.

11. Apparatus according to claim 9, wherein said apparatus comprises a further sensor, said further sensor being constructed and arranged to detect a presence or absence of a pellicle, and said actuator is constructed and arranged to adjust the position of the pattern plane in response to the presence or absence of the pellicle as detected by the further sensor.

12. A device manufacturing method for use with a lithographic projection apparatus comprising
providing a beam of radiation;
patterning the beam to produce a pattern in its cross-section;
projecting the patterned beam of radiation onto a target portion of the layer of radiation-sensitive material; and
controlling a position of a part of a reticle-stage module, said part of the reticle-stage module comprising a support structure to hold a patterning structure, a short-stroke module to fine-position said support structure, and a long-stroke module to coarse-position the patterning structure, along said optical axis to compensate for a virtual shift of a pattern plane of said patterning structure due to a pellicle of said patterning structure.

13. The method according to claim 12, further comprising further adjusting said projection system to adapt a position of its focal plane to coincide with said pattern plane to compensate for said virtual shift.

14. The method according to claim 12, further comprising detecting a position of the pattern plane, and adjusting the position of the pattern plane in response to presence or absence of the pellicle.

15. The method according to claim 12, further comprising detecting a presence or absence of a pellicle, and adjusting the position of the pattern plane in response to the detected presence or absence of the pellicle.

16. A lithographic projection apparatus comprising:
a reticle-stage module comprising a support structure to support a patterning device, a short-stroke module to fine-position said support structure, and a long-stroke module to coarse-position the patterning device, the patterning device constructed and arranged to pattern a projection beam of radiation according to a desired pattern;
a pellicle, disposed proximate the patterning device and having optical properties producing a virtual shift in a plane of focus of the pattern;
a substrate table to hold a substrate;
a projection system to project the patterned beam onto a target portion of the substrate; and
a position controller constructed and arranged to adjust a position of at least the long-stroke module, the short-stroke module and the support structure along a portion of an optical axis of the lithographic projection apparatus passing through the patterning device to compensate for a virtual shift of a pattern plane of the patterning device due to optical properties of the pellicle.

17. Apparatus according to claim 16, further comprising an optical controller that is constructed and arranged to adjust a focal plane of the projection system by modifying a position of an optical element of said projection system, relative to a position of another optical element of said projection system.

18. Apparatus according to claim 16, wherein the position controller further comprises an adjusting device to adjust the projection system to adapt a position of its focal plane to coincide with the pattern plane.

19. Apparatus according to claim 16, further comprising a sensor configured to detect a position of the pattern plane, and wherein the position controller comprises an actuator configured to adjust the position of the pattern plane in response to presence or absence of the pellicle.

20. Apparatus according to claim 16, further comprising a sensor configured to detect a presence or absence of a pellicle, and wherein the position controller comprises an actuator configured to adjust the position of the pattern plane in response to the presence or absence of the pellicle as detected by the sensor.

* * * * *